United States Patent [19]
Vora

[11] 3,980,874
[45] Sept. 14, 1976

[54] BINARY TO MODULO M TRANSLATION
[75] Inventor: Chandrakant R. Vora, Audubon, Pa.
[73] Assignee: Burroughs Corporation, Detroit, Mich.
[22] Filed: May 9, 1975
[21] Appl. No.: 576,002

[52] U.S. Cl. .......................... 235/175; 340/347 DD
[51] Int. Cl.² .................... G06F 7/385; H03K 13/24
[58] Field of Search ........... 235/175, 176, 168, 154; 340/347 DD

[56] References Cited
UNITED STATES PATENTS

| | | |
|---|---|---|
| 3,316,393 | 4/1967 | Ruthazer .............................. 235/175 |
| 3,863,248 | 1/1975 | Deschenes et al. .......... 340/347 DD |
| 3,882,483 | 5/1975 | Burke et al. ................. 340/347 DD |

OTHER PUBLICATIONS
L. Y. Liu et al., "Residue Generation of Binary Nos. in 2's Comp. Form" *IBM Tech. Disclosure Bulletin*, vol. 9, No. 2, July 1966, pp.158–159.
B. E. Bliss, "Table Lookup REsidue Adder" *IBM Tech. Disclosure Bulletin*, vol. 11, No. 8, Jan. 1969, pp. 1017–1018.
D. K. Banerji et al., "On Translation Algorithms in Residue No. Systems," *IEEE Trans. on Computers*, vol. c–21, No. 12, Dec. '72, pp. 1281–1285.
D. K. Banerji, "A Novel Implementation Method For Add. & Subt. in Residue No. Systems" *IEEE Trans–on Computers*, Jan. 1974, pp. 106–109.

*Primary Examiner*—David H. Malzahn
*Attorney, Agent, or Firm*—Kevin R. Peterson; Edward J. Feeney, Jr.; Leonard C. Brenner

[57] ABSTRACT

Modulo M translation is performed on a large binary number of n bits by grouping the binary number in contiguous sets of approximately K bits each, storing the modulo M residues for each K bit set in an individually associated pre-stored ROM, reading the modulo M residues for a particular K bit segment of a binary number out of the ROMs, and performing modulo M addition on the read-out residues. Thus, modulo M translation of a positive number is accomplished in $n/k$ modulo M additions and a table look-up, with the look-up table being stored in $n/k$ ROMs. A subsequent modulo M subtraction is performed if the binary number is negative.

11 Claims, 5 Drawing Figures

| BINARY ADDRESS INPUT EQUIVALENT DECIMAL VALUE IN THE GROUP 128X__ | | | | OUTPUT MODULE 67 | BINARY ADDRESS INPUT EQUIVALENT DECIMAL VALUE IN THE GROUP 128X__ | | | | OUTPUT MODULE 67 |
|---|---|---|---|---|---|---|---|---|---|
| 0, | 67, | 134, | 201 | 0 | 34, | 101, | 168, | 235 | 64 |
| 1, | 68, | 135, | 202 | 61 | 35, | 102, | 169, | 236 | 58 |
| 2, | 69, | 136, | 203 | 55 | 36, | 103, | 170, | 237 | 52 |
| 3, | 70, | 137, | 204 | 49 | 37, | 104, | 171, | 238 | 46 |
| 4, | 71, | 138, | 205 | 43 | 38, | 105, | 172, | 239 | 40 |
| 5, | 72, | 139, | 206 | 37 | 39, | 106, | 173, | 240 | 34 |
| 6, | 73, | 140, | 207 | 31 | 40, | 107, | 174, | 241 | 28 |
| 7, | 74, | 141, | 208 | 25 | 41, | 108, | 175, | 242 | 22 |
| 8, | 75, | 142, | 209 | 19 | 42, | 109, | 176, | 243 | 16 |
| 9, | 76, | 143, | 210 | 13 | 43, | 110, | 177, | 244 | 10 |
| 10, | 77, | 144, | 211 | 7 | 44, | 111, | 178, | 245 | 4 |
| 11, | 78, | 145, | 212 | 1 | 45, | 112, | 179, | 246 | 65 |
| 12, | 79, | 146, | 213 | 62 | 46, | 113, | 180, | 247 | 59 |
| 13, | 80, | 147, | 214 | 56 | 47, | 114, | 181, | 248 | 53 |
| 14, | 81, | 148, | 215 | 50 | 48, | 115, | 182, | 249 | 47 |
| 15 | 82, | 149, | 216 | 44 | 49, | 116, | 183, | 250 | 41 |
| 16, | 83, | 150, | 217 | 38 | 50, | 117, | 184, | 251 | 35 |
| 17, | 84, | 151, | 218 | 32 | 51, | 118, | 185, | 252 | 29 |
| 18, | 85, | 152, | 219 | 26 | 52, | 119, | 186, | 253 | 23 |
| 19, | 86, | 153, | 220 | 10 | 53, | 120, | 187, | 254 | 16 |
| 20, | 87, | 154, | 221 | 14 | 54, | 121, | 188, | 255 | 11 |
| 21, | 88, | 155, | 222 | 8 | 55, | 122, | 189 | | 5 |
| 22 | 89, | 156, | 223 | 2 | 56, | 123, | 190 | | 66 |
| 23, | 90, | 157, | 224 | 63 | 57, | 124, | 191 | | 60 |
| 24, | 91, | 158, | 225 | 57 | 58, | 125, | 192 | | 54 |
| 25, | 92, | 159, | 226 | 51 | 59, | 126, | 193 | | 48 |
| 26, | 93, | 160, | 227 | 45 | 60, | 127, | 194 | | 42 |
| 27, | 94, | 161, | 228 | 39 | 61, | 128, | 195 | | 36 |
| 28, | 95, | 161, | 229 | 33 | 62, | 129, | 196 | | 30 |
| 29, | 96, | 165, | 230 | 27 | 63, | 130, | 197 | | 24 |
| 30, | 97, | 164, | 231 | 21 | 64, | 131, | 198 | | 18 |
| 31 | 98, | 165, | 232 | 15 | 65, | 132, | 199 | | 12 |
| 32, | 99, | 166, | 233 | 9 | 66, | 133, | 200 | | 6 |
| 33, | 100, | 167, | 234 | 3 | 67, | 134, | 201 | | 0 |

_Fig. 2_

BINARY TO MODULO M TRANSLATION

BACKGROUND OF THE INVENTION

This invention relates to a method and apparatus for performing a modulo M translation on a large binary number and more particularly to a high speed method and reliable low-cost apparatus for performing the translation.

One area requiring such translation is in matrix calculations performed by large parallel memory array computers such as the one described by Budnik and Kuck in "The Organization and Use of Parallel Memories", IEE Translations on Computers, December 1971, pages 1566–1569. In such calculations a modulo 67 translation may be performed on a binary number in the order of 23 bits.

A straight forward modulo M translation of a large number is performed by dividing the number by M and storing the remainder as the answer. However, division of a large number is prohibitively slow and impractical for high-speed calculations.

Alternatively, by applying principles of residue arithmetic, a binary number of $n$ bits may be represented as the sum of approximately weighted $n$ binary bits. The modulo M residue may be determined beforehand for each of the $n$ bits thereby permitting the binary to modulo M translation to be accomplished by $n$ modulo M additions. However, $n$ additions may be prohibitively slow for large values of $n$.

OBJECTS AND SUMMARY OF THE INVENTION

It is therefore an object of the invention to provide a high speed method of performing a binary to modulo M translation of a large number.

It is a further object of the invention to perform binary to modulo M translation of large numbers utilizing simple low-cost reliable digital hardware.

The above and other objects of the invention are realized by performing a piece meal modulo M translations on a large binary number and performing modulo M additions on the piece meal results. A binary number is sectioned into contiguous segments of approximately $k$ bits each with each $k$ bit segment addressing an individually associated ROM. The modulo M translations for each segment are predetermined and stored in the individually associated ROMs. The ROM outputs are combined by modulo M addition to complete the translation.

The system configuration and operational details given above have been presented in simplified form. Other features of the invention will become more fully apparent in the drawings and detailed description presented hereinafter.

BRIEF DESCRIPTION OF THE DRAWINGS

FIG. 2 is a table illustrating the method of prestoring modulo M translations in a ROM as utilized by the invention;

DETAILED DESCRIPTION OF THE INVENTION

Binary to modulo M translation is accomplished in the present invention by segmenting the binary number to be translated in groups of bits which are independently translated and thereafter summed by modulo M addition to complete the overall translation. As an example, segmentation may occur as follows:

$$|B|_m| = |bn\ bn-1\ \ldots\ bo|_m$$

$$|B|_m = |(bn)\ (2^n) + (bn-1)\ (2^{n-1}) + \ldots\ (bn-7)\ (2^{n-7})|_m + |(bn-8)\ (2^{n-8}) + \ldots\ (bn-15)\ (2^{n-15})|_m + |(bn-16)\ (2^{n-16}) + \ldots\ (1)\ (2) + (bo)|_m$$

Where $B$ equals a binary of length $n$, $bn$ equals the $n^{th}$ significant binary bit (either a 1 or a 0) and $B_m$ equals the modulo M translation of the binary number $B$ where M equals an integer and the modulo M translation equals the residue remaining from the operation $B$ divided by M.

Specific examples of the invention applied to varying lengths of binary numbers for a fixed M follow to detail and clarify hardware implementation of the invention and demonstrate practical real-time advantages of same.

Figure 1:
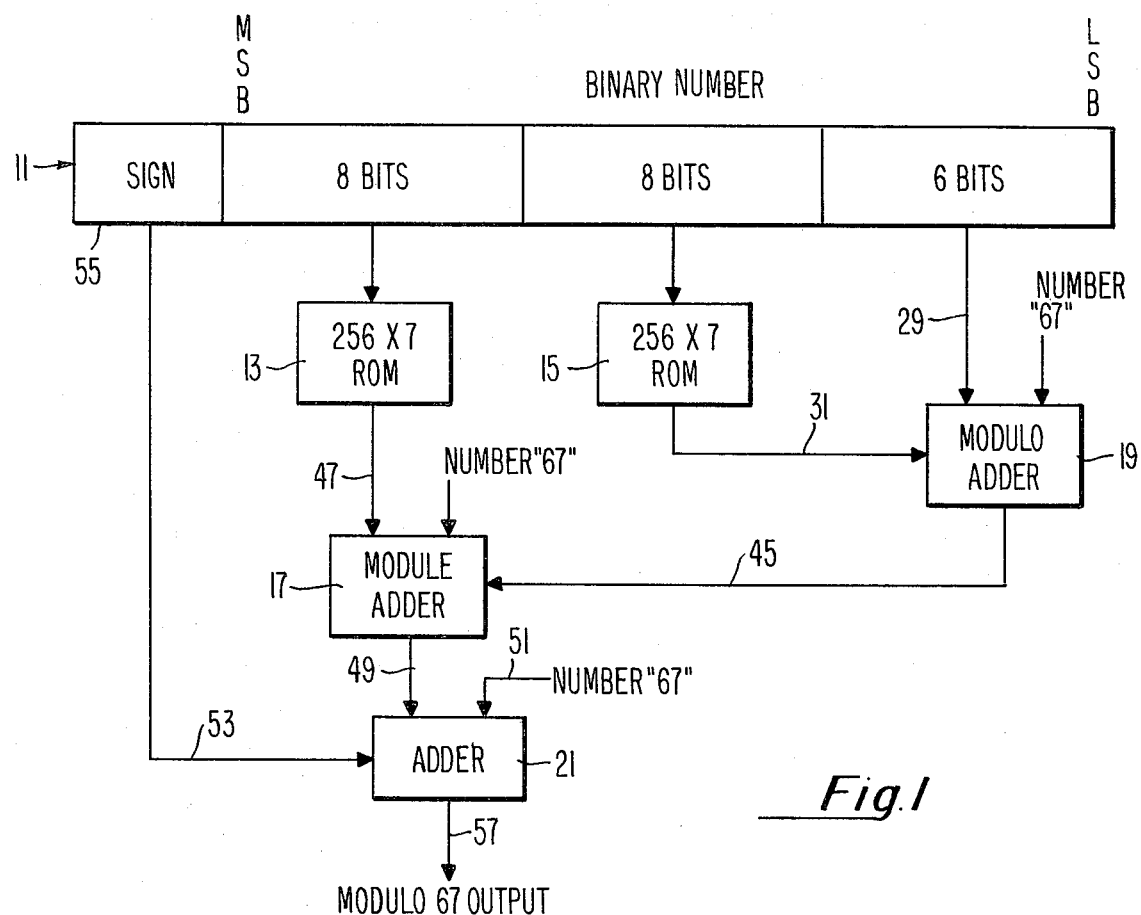
FIG. 1 is a diagram of a binary to modulo M translator of the present invention for use with a 23 bit signed binary number and a modulo M of 67.

Referring now to FIG. 1, a 23 bit signed binary number 11 is translated by the invention into a modulo 67 number with only two relatively small 256 × 7 bit ROMs 13 and 15, two modulo adders 17 and 19 and one simple adder 21. As will be shown hereinafter, such translation occurs in minimum processor or clock time.

The significant bits of the binary number 11 are segmented into 3 parts. The 8 most significant bits address the 256 × 7 ROM 13, the 8 middle significant bits address the 256 × 7 ROM 15, and the 6 least significant bits feed a first input 29 of the modulo adder 19. A description of the function and implementation of the modulo adder 19 follows a discussion of the ROM's 13 and 15.

ROM's 13 and 15 are standard read-only memories having 256 ($2^8$) addresses and a required word length of 7 bits for modulo 67 translation since 67 is less than 128 ($2^7$) and more than 64 ($2^6$). Each ROM or both together may be fabricated on a single LSI chip. In a working model of the invention, a satisfactory ROM was constituted by paralleling two Motorola MCM10150 ROM's to form a 256 × 8 ROM.

ROM's 13 and 15 are addressed by selected eight bit segments of the binary number 11 and output predetermined modulo translations for the selected 8 bit binary addresses. ROM 15 is addressed by the 8 bits representing the equivalent decimal values of 128 time I, where I equals all integers between 0 and 255 inclusive. FIG. 2 shows all the 256 modulo 67 outputs for the 8 bits inputed to ROM 15. As an illustrative example, the output for decimal equivalent address 128 × 2 = (256) is 55 = (256 – 3 × 67). The other 255 ROM outputs are predetermined in like fashion and are stored in the ROM 15. The modulo outputs for ROM 13 are determined similarly but are calculated for the values of 32768 times I, where I equals all integers between 0 and 255 inclusive.

ROM 15 is outputted into a second input 31 of Modulo Adder 19. The modulo adder 19 performs the function of summing all inputs and outputting the modulo M result. Since both inputs 29 and 31 to Modulo Adder 19 are less than the modulo M of 67, the modulo addition is merely the sum of the inputs or the sum of the inputs minus 67 if the input sum is 67 or greater. Thus modulo addition could be performed by the steps of summing the inputs, comparing the sum to the number 67, and subtracting 67 from the sum if so indicated by the comparison.

Figure 3:
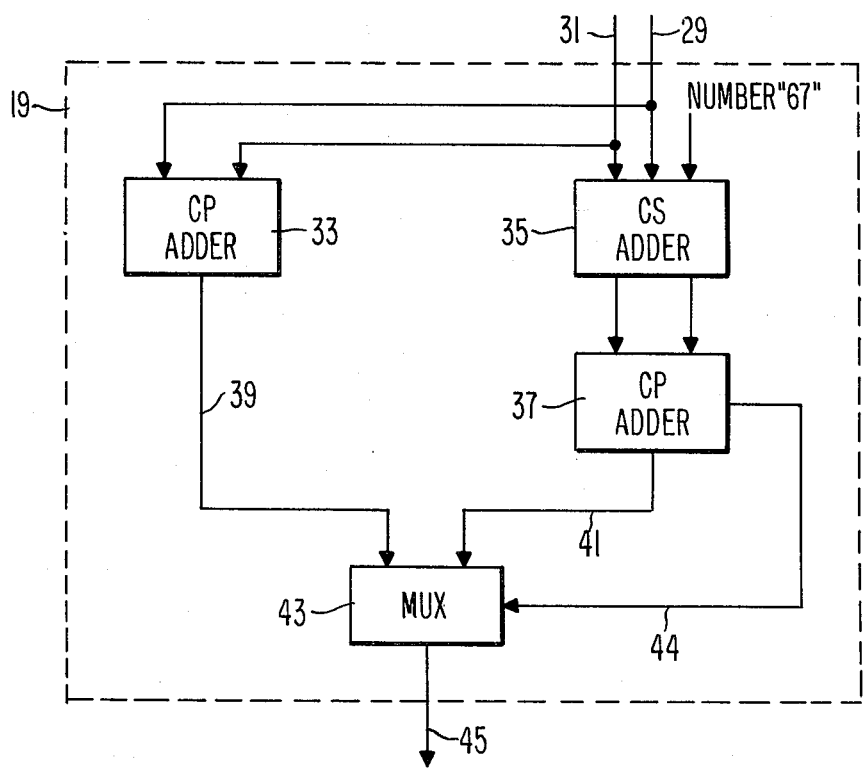
FIG. 3 is a diagram of a modulo M adder used in the translator of the present invention.

However, as shown in FIG. 3, modulo addition in the preferred embodiment of the invention occurs by performing in parallel the steps of summing the inputs and summing the inputs minus 67 and then multiplexing out either the straight input sum or the input sum minus 67 depending on whether the latter is negative or positive. Modulo Adder 19 having as inputs 29 and 31 sums these inputs in a first carry propagate adder 33. A suitable adder for this task is the Motorola MC10181 4-bit Arithmetic Logic Unit. Since inputs 29 and 31 are each 7 bits wide, two MC10181's operating in parallel are required for the full addition.

In parallel with the straight summing of the inputs, the summing of the inputs minus 67 is performed in in a series operation of a carry save adder 35 and a second carry propagate adder 37. The carry save adder 35 may be fabricated from two Motorola Dual High Speed Adders/Subtractors MC10180 operating in parallel. Second Carry Propagate Adder 37 may be fabricated identical to the first Carry Propagate Adder 35.

The outputs 39 and 41 of First Carry Propagate Adder 35 and Second Carry Propagate Adder 37 respectively, provide inputs to a multiplexer 43 which throughputs either output 39 or output 41, depending on whether output 41 is negative or positive as indicated at the toggle or control input 44. Multiplexer 43 may be fabricated by paralleling two Motorola Quad 2-Input MUX MC10173 Multiplexers.

Referring again to FIG. 1, the output 45 of the multiplexer 43 is fed as one input to the Modulo Adder 17 which functions as Modulo Adder 19 described above. A second input to Modulo Adder 17 is provided by the output 47 of ROM 13. ROM 13 stores the modulo 67 translations for the most significant 8 bits of signed binary number 11 just as ROM 15 stores the modulo 67 translations for the middle significant 8 bits. The modulo 67 translation for ROM 13 are predetermined in a manner similar to the method used for predetermining the modulo 67 translations for ROM 15 as described above.

The output of Modulo Adder 17 is fed as a first input to adder 21. A second input 51 represents the modulo number 67. A control input 53 is provided by the sign bit 55 of binary number 11. If the sign bit 55 is positive, the first input 49 is in effect passed straight through the adder 21 to the adder output 57 which presents the completed binary-to-module 67 translation. Conversely, if the sign bit 55 is negative, then the first input 49 is subtracted from the second input 51 representing the number 67 and the result is outputted representing the completed translation.

Adder 21 may be fabricated from two parallel Motorola MC10181 4-bit Arithmetic Logic Units. Some commercially available adder/substractors perform subtraction by merely complementing one input and adding. The result yields the true subtraction value minus 1. In such a situation the number 68 need be provided to the second adder input 51 to generate the correct binary-to-modulo 67 translation.

As can be deduced from the above, if the binary number to be translated is always positive, adder 21 is not needed, since the output of modulo 17 provides the completed translation. To further illustrate and clarify the full extent of the instant invention, two other examples of modulo 67 translation will be presented.

Figure 4:
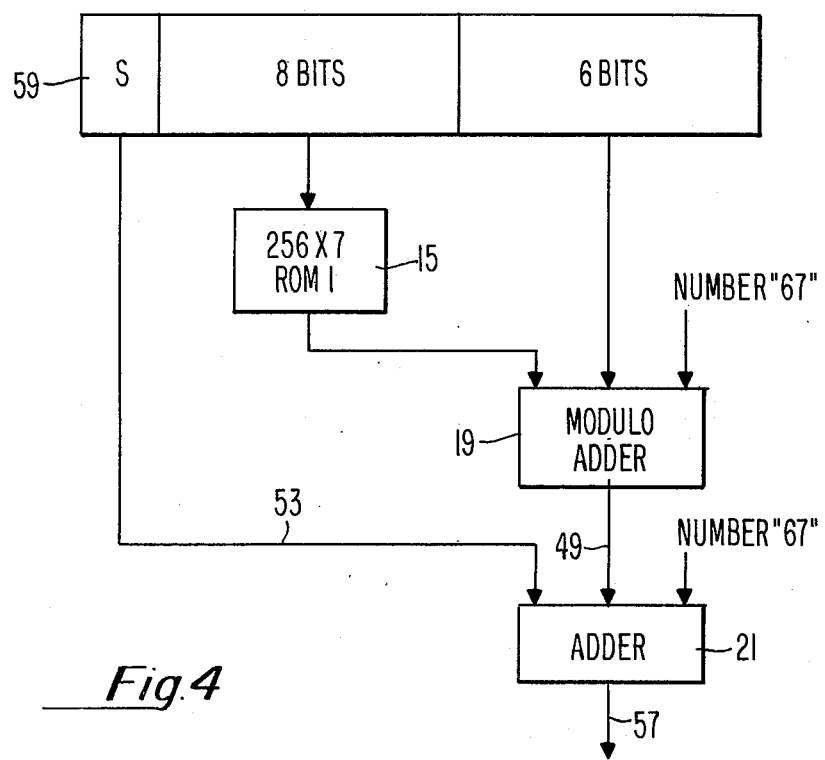
FIG. 4 is a diagram of the modulo M translator of the present invention for use with a 15 bit signed binary number.

First, referring to FIG. 4, a 15 bit signed binary number 59 is translated to modulo 67 using only one ROM, one modulo adder, and one simple adder. By comparison to FIG. 1, it is clear that the 15 bit signed binary translation occurs in the same manner as for the translation of a 23 bit signed binary number minus the ROM 13 and the Modulo Adder 17 which are not required for translating a 15 bit number.

Figure 5:
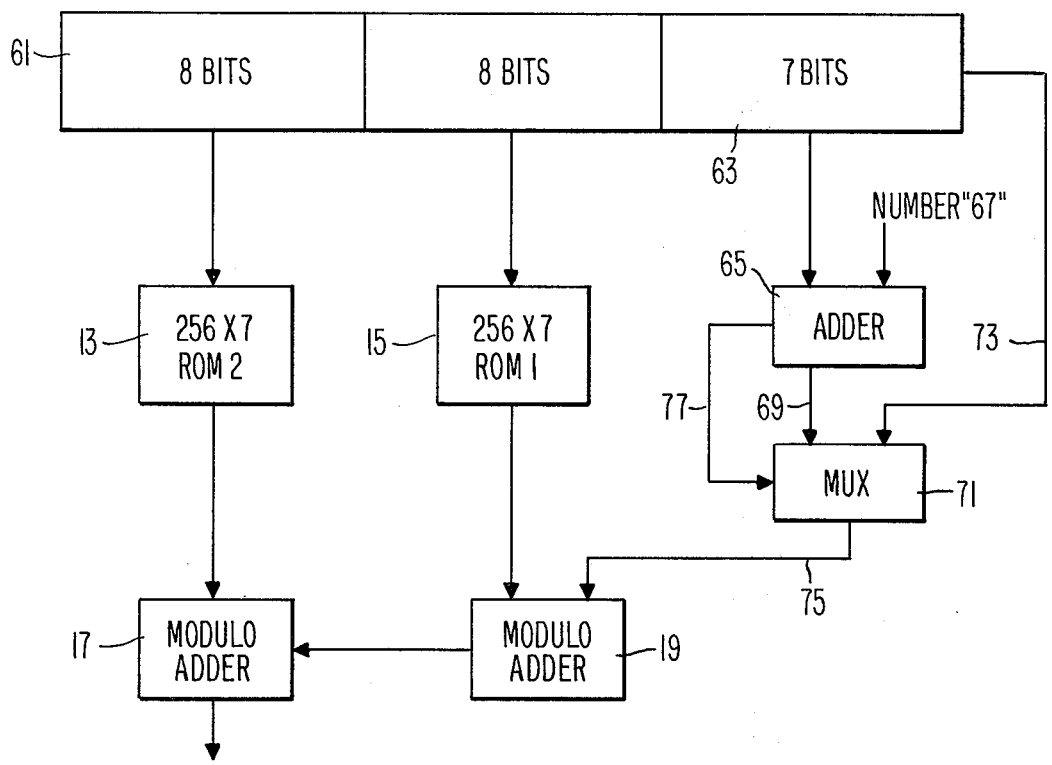
FIG. 5 is a diagram of the modulo M translator of the present invention for use with a 23 bit positive-only binary number.

Second, referring to FIG. 5, a 23 positive-only binary number 61 is translated to modulo 67 using only two ROMs, two modulo adders, one simple adder, and one multiplexer. By comparison to FIG. 1, it is clear that the 23 bit positive-only binary number translation occurs in a manner similar to that for translation of a 23 bit signed binary number except for the translation of the least significant 7 bits. Seven bits may represent numbers from 0 up to 127. Hence, the modulo 67 translation is either the binary number directly (for binary representations from 0 to 66) or the binary number minus 67 (for binary representations from 67 to 127). The number 67 is subtracted from the least 7 bits 63 in adder 65 which may be fashioned from two parallel Motorola MC10181 4-bit Arithmetic Logic Units. The output of adder 65 is fed as a first input 69 of multiplexer 71 which may be fashioned from two Motorola MC10173 Quad 2-Input MUX multiplexers. The least 7 significant bits 63 provide the second input 73 to the multiplexer 71. The output 75 of the multiplexer 71 is identical to either the first input 69 or second input 73 depending on whether or not the adder 65 result is negative or positive. A control input 77 to the multiplexer 71 is provided from the adder 65 to toggle the multiplexer 71 between the first input 69 and the second input 73 as required. Completion of the modulo 67 translation for the 23 bit positive-only binary number 61 occurs in a manner similar to that above-described for the 23 bit signed binary number 11.

The above description of various binary to modulo 67 translations illustrate the speed, simplicity, and flexability of the instant binary to modulo M invention. The above description of the illustrated embodiments of the invention has been by way of example only and should not be taken as a limitation on the scope of the invention as claimed.

What is claimed is:

1. An apparatus for translating to modulo M a binary number of value greater than a number M, said number M being relatively prime to said binary number, said apparatus comprising:

means having two inputs for summing modulo M binary numerical data conveyed thereto;

means for conveying to a first of said two inputs a first portion of said binary number, said first portion being binary numerical data of value less than said number M;

means including a memory for translating to modulo M a second portion of said binary number, said second portion being said binary number minus said first portion; and means for conveying to a second of said two inputs said translated second portion.

2. The apparatus according to claim 1 wherein said means for summing includes a modulo M adder.

3. The apparatus according to claim 2 wherein said modulo M adder comprises:
   a first binary input for receiving binary numerical representations less than said number M;
   a second binary input for receiving binary numerical representations less than said number M;
   first adder means for summing binary representations received on said first and said second binary inputs;
   second adder means operating in parallel with said first adder means, said second adder means for summing binary representations received on said first and second binary inputs minus a binary representation of said number M; and
   multiplexer means responsive to the summing of said second adder means for outputting the summing of said second adder means when the summing of said second adder means is positive and for outputting the summing of said first adder means when the summing of said second adder is negative.

4. The apparatus according to claim 3 wherein said first adder means includes a carry propagate adder; and
   said second adder means includes in series a carry save adder and a carry propagate adder.

5. The apparatus according to claim 1 wherein said number M is a prime number.

6. The apparatus according to claim 5 wherein said prime number is 67.

7. An apparatus for translating to modulo M a positive-only binary number of value two times a number M, said M being relatively prime to said positive-only binary number, said apparatus comprising:
   a first modulo M translator for translating a first portion of said positive-only binary number, said first portion representing a binary number of value less than two times said number M, said first modulo M translator including
   adder means inputted by said first portion for summing said first portion minus said M and for indicating whether said summing produces a positive or negative sum, and
   multiplex means responsive to said indicating for outputting said adder means summing when said indicating is positive and for outputting said first portion when said indicating is negative;
   a second modulo M translator for translating the remaining portion of said positive-only binary number, said remaining portion being the binary number minus said first portion, said second modulo M translator including a memory system addressed by said remaining portion, said memory system including at least two memories, each of said at least two memories addressed by an individual segment of contiguous bits in said remaining portion and outputting a prestored modulo M translation for each memory address;
   a plurality of modulo M adders, one modulo M adder individually associated with each of said at least two memories; and
   means connecting each of said at least two memories with the individual modulo M adder associated therewith, said multiplexer means with one of said plurality of modulo M adders, and said plurality of modulo M adders with each other for providing at the output of one of said plurality of modulo M adders, a modulo M translation of said positive-only binary number.

8. The apparatus according to claim 7 wherein each of said plurality of modulo M adders includes:
   a first binary input for conveying binary numerical representations less than said number M;
   a second binary input for conveying binary numerical representations less than said number M;
   first adder means for summing the binary representations on said first and second binary inputs;
   second adder means operating in parallel with said first adder means, said second means for summing the binary representations on said first and second binary inputs minus a binary representation of said number M; and
   multiplexer means responsive to the summing of said second adder means for outputting the summing of said second adder means when the summing of said second adder means is positive and for outputting the summing of said first adder means when the summing of said second adder is negative.

9. The apparatus according to claim 8 wherein said number M is a prime number.

10. The apparatus according to claim 9 wherein said prime number is 67.

11. A modulo M adder for use in a binary to modulo M translator comprising:
   a first binary input for conveying binary numerical representations less than a number M;
   a second binary input for conveying binary numerical representations less than said number M;
   first adder means for summing the binary representations conveyed on said first and second binary inputs;
   second adder means operating in parallel with said first adder means, said second adder means for summing binary representations conveyed on said first and second binary inputs minus a binary representating of said number M; and
   multiplexer means responsive to the summing of said second adder means for outputting the summing of said second adder means when the summing of said second adder means is positive and for outputting the summing of said first adder means when the summing of said second adder is negative.

* * * * *